(12) United States Patent
Horikami et al.

(10) Patent No.: US 10,473,719 B2
(45) Date of Patent: Nov. 12, 2019

(54) SYSTEM AND METHOD FOR SEPARATING AND MEASURING TWO SIGNALS SIMULTANEOUSLY PRESENT ON A SIGNAL LINE

(71) Applicant: Keysight Technologies, Inc., Santa Rosa, CA (US)

(72) Inventors: Hiroyuki Horikami, Hyogo (JP); Tatsuo Yoda, Tokyo (JP); Yoshiyuki Yanagimoto, Hyogo (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 133 days.

(21) Appl. No.: 15/782,814

(22) Filed: Oct. 12, 2017

(65) Prior Publication Data

US 2019/0113569 A1 Apr. 18, 2019

(51) Int. Cl.
| | | |
|---|---|---|
| *G01R 31/317* | (2006.01) | |
| *G01R 13/02* | (2006.01) | |
| *G01R 27/28* | (2006.01) | |
| G01R 27/06 | (2006.01) | |
| G01R 31/11 | (2006.01) | |

(52) U.S. Cl.
CPC ....... *G01R 31/31725* (2013.01); *G01R 13/02* (2013.01); *G01R 27/28* (2013.01); *G01R 27/06* (2013.01); *G01R 31/11* (2013.01)

(58) Field of Classification Search
CPC ...... G01R 31/00; G01R 31/28; G01R 31/317; G01R 31/31725; G01R 31/11; G01R 13/00; G01R 13/02; G01R 19/00; G01R 19/2506; G01R 27/00; G01R 27/02; G01R 27/04; G01R 27/06; G01R 27/28; G01R 35/00; G01R 35/005
USPC ....... 324/600, 629, 637, 638, 642, 646, 500, 324/534, 76.11, 76.12, 76.19, 76.35
See application file for complete search history.

(56) References Cited

U.S. PATENT DOCUMENTS

| | | | | |
|---|---|---|---|---|
| 4,507,619 | A | * | 3/1985 | Dijkstra ................ H03F 1/0227 330/263 |
| 5,298,678 | A | * | 3/1994 | Higashi .................. G10H 5/007 84/630 |
| 5,425,052 | A | | 6/1995 | Webster et al. |
| 5,557,646 | A | * | 9/1996 | Honma .............. H03H 21/0012 375/232 |
| 6,580,278 | B1 | | 6/2003 | Harrison |
| 6,639,393 | B2 | | 10/2003 | Tasker et al. |
| 7,271,575 | B2 | | 9/2007 | Pickerd et al. |

(Continued)

*Primary Examiner* — Hoai-An D. Nguyen

(57) ABSTRACT

A measurement instrument configured to perform an associated method separates two signals which are present on the same signal line at the same time (e.g., an incident signal and a reflected signal) so that it can measure each signal by itself. In an example, the method may include: receiving a first probed waveform from a first location on a signal line between a source device and a destination device while an output of the source device sends an incident signal to an input of the destination device via the signal line; receiving a second probed waveform from a second location on the signal line, while the output of the source device sends the incident signal to the input of the destination device via the signal line; and ascertaining from the first probed waveform and the second probed waveform the reflection coefficient at the input of the destination device.

20 Claims, 14 Drawing Sheets

(56) References Cited

U.S. PATENT DOCUMENTS 7,408,363 B2 8/2008 Tan et al.
2016/0018450 A1 1/2016 Tan et al.

* cited by examiner

SYSTEM AND METHOD FOR SEPARATING AND MEASURING TWO SIGNALS SIMULTANEOUSLY PRESENT ON A SIGNAL LINE

BACKGROUND

In many systems and devices, especially, for example, devices and systems which include high speed digital communication circuits, more than one signal may be present on a given signal line at the same time. In some cases, this may involve an incident signal on a signal line from an outset of a first device (e.g., a memory controller) to an input of a second device (e.g., a memory device), and a corresponding reflection signal on the same signal line from the input of the second device back to the output of the first device. In those cases, the ratio of the magnitude of the reflected signal to the magnitude of the incident signal may be referred to as the reflection coefficient of the input of the second device. In other cases, the first signal may be an output signal of a first device which is transmitted along the signal line to an input/output of a second device, and the second signal may be an output signal of a second device which is transmitted along the signal line to the input/output of a second device. This may be the case when the first device and second device engage in full-duplex communication via the signal line.

The measurement and analysis of such signals may be difficult and complicated.

Prior solutions in the case of measuring incident and reflected signals have included cutting the signal line, attaching a radio frequency (RF) connector to the cut signal line, and measuring the reflection coefficient as the S11 parameter using a network analyzer. This is clearly undesirable. Furthermore, the time constant of the network analyzer depends on the IF bandwidth, which may typically be about 100 kHz (which means a time constant of about 10 µs.). However, in some cases such as a double data rate (DDR) memory device, the data rate along the signal line in actual operation may be in the range of 2 Gbps, which has a fundamental frequency component at 1 GHz (1 nanosecond) and a third harmonic of 333 ps. This means that the network analyzer cannot measure the reflection coefficient for the device at its normal operating speed.

Other solutions for some types of RF signals have included embedding one or more directional couplers in the signal line so that coupled signals may be measured in both directions. Adding directional couplers to a signal line simply to allow measurement of reflection coefficients involves an additional cost, additional size, and additional signal loss, all of which are undesirable. And in a circuit with many signal lines and device inputs or outputs to be measured, these effects are all multiplied. Furthermore, in the case of digital signals, such directional couplers are not typically employed.

Prior solutions in the case of measuring two output signals of two devices on a shared signal line involve stopping transmission by one of the two devices to make one of the signals silent while measuring or evaluating the other signal. However, it is often desired to test a circuit in its actual operating mode where two devices are transmitting at the same time such that two signals are present on the signal line at the same time. Accordingly, for such tests, it is not possible to stop transmission from one of the devices while measuring a signal from the other device.

Accordingly, it would be desirable to provide a new system and method for measuring two signals which are simultaneously present on a signal line. It would further be desirable to provide a new system and method for measuring the reflection coefficient of an input or output of a first device connected to second device via a signal line.

SUMMARY

A method, comprises: receiving at a measurement instrument a first probed waveform which is probed at a first location on a signal line between a source device and a destination device while an output of the source device sends an incident signal to an input of the destination device via the signal line; receiving at the measurement instrument a second probed waveform probed at a second location on the signal line while the output of the source device sends the incident signal to the input of the destination device via the signal line, wherein the second location is separated and spaced apart from the first location by a separation distance, wherein the separation distance produces a time delay for the incident signal to propagate from the first location to the second location; and the measurement instrument ascertaining from the first probed waveform and the second probed waveform a reflection coefficient at the input of the destination device.

In some embodiments, ascertaining from the first probed waveform and the second probed waveform the reflection coefficient at the input of the destination device comprises: the measurement instrument delaying the first probed waveform by a processing delay equal to the time delay, to produce a delayed first probed waveform; and the measurement instrument subtracting the delayed first probed waveform from the second probed waveform to produce a reflected signal from the input of the destination device.

In some versions of these embodiments, ascertaining from the first probed waveform and the second probed waveform the reflection coefficient at the input of the destination device further comprises: the measurement instrument delaying the second probed waveform by the processing delay equal to the time delay, to produce a delayed second probed waveform; and the measurement instrument subtracting the delayed second probed waveform from the first probed waveform to produce the incident signal from the output of the source device.

In some versions of these embodiments, ascertaining from the first probed waveform and the second probed waveform the reflection coefficient at the input of the destination device further comprises: the measurement instrument determining the incident signal at the input of the destination device; the measurement instrument determining the reflected signal at the input of the destination device; the measurement instrument determining a frequency response of the incident signal at the input of the destination device; the measurement instrument determining a frequency response of the reflected signal at the input of the destination device; and the measurement instrument determining the reflection coefficient at the input of the destination device by dividing the frequency response of the reflected signal at the input of the destination device by the frequency response of the incident signal at the input of the destination device.

In some embodiments, the measurement instrument is an oscilloscope comprising one or more probe inputs for receiving the first and second probed waveforms, a processor configured to process the first and second probed waveforms, and a display configured to display an output signal of the oscilloscope.

In some versions of these embodiments, the first probed waveform which is probed at the first location on the signal line and the second probed waveform probed at the second location on the signal line are both provided to a same probe input among the one or more probe inputs via a single probe. In other versions of these embodiments, the first probed waveform may be obtained via a first probe connected to a first probe input, and the second probed waveform may be obtained via a second probe connected to a second probe input.

A measurement instrument, comprises: one or more probe inputs configured to receive a first probed waveform which is probed at a first location on a signal line between a source device and a destination device while an output of the source device sends an incident signal to an input of the destination device via the signal line, and further configured to receive a second probed waveform probed at a second location on the signal line while the output of the source device sends the incident signal to the input of the destination device via the signal line, wherein the second location is separated and spaced apart from the first location by a separation distance, wherein the separation distance produces a time delay for the incident signal to propagate from the first location to the second location; and a processor which is configured to ascertain from the first probed waveform and the second probed waveform a reflection coefficient at the input of the destination device.

In some embodiments, the processor is configured to ascertain from the first probed waveform and the second probed waveform the reflection coefficient at the input of the destination device by: causing the measurement instrument to delay the first probed waveform by a processing delay equal to the time delay, to produce a delayed first probed waveform; and subtracting the delayed first probed waveform from the second probed waveform to produce a reflected signal from the input of the destination device.

In some versions of these embodiments, the processor is configured to ascertain from the first probed waveform and the second probed waveform the reflection coefficient at the input of the destination device by: causing the measurement instrument to delay the second probed waveform by the processing delay equal to the time delay, to produce a delayed second probed waveform; and subtracting the delayed second probed waveform from the first probed waveform to produce the incident signal.

In some versions of these embodiments, the processor is configured to ascertain from the first probed waveform and the second probed waveform the reflection coefficient at the input of the destination device by: determining the incident signal at the input of the destination device; determining the reflected signal at the input of the destination device; determining a frequency response of the incident signal at the input of the destination device; determining a frequency response of the reflected signal at the input of the destination device; and determining the reflection coefficient at the input of the destination device by dividing the frequency response of the reflected signal at the input of the destination device by the frequency response of the incident signal at the input of the destination device.

In some embodiments, the measurement instrument includes a display configured to display the first probed waveform, the second probed waveform, and the reflection coefficient.

In some versions of these embodiments, the first probed waveform which is probed at the first location on the signal line and the second probed waveform probed at the second location on the signal line are both provided to a same probe input among the one or more probe inputs via a single probe. In other versions of these embodiments, the first probed waveform may be obtained via a first probe connected to a first probe input, and the second probed waveform may be obtained via a second probe connected to a second probe input.

A method, comprises: receiving at a measurement instrument a first probed waveform which is probed at a first location on a signal line between a first device and a second device while an output of the first device sends a first signal to an input of the second device via the signal line and while an output of the second device sends a second signal to an input of the first device via the signal line; receiving at the measurement instrument a second probed waveform probed at a second location on the signal line while the output of the first device sends the first signal to the input of the second device via the signal line and while the output of the second device sends the second signal to the input of the first device via the signal line, wherein the second location is separated and spaced apart from the first location by a separation distance, and wherein the separation distance produces a time delay for the first signal to propagate from the first location to the second location and for the second signal to propagate from the second location to the first location; the measurement instrument ascertaining an estimate of the first signal from the first probed waveform and the second probed waveform; and the measurement instrument ascertaining an estimate of the second signal from the first probed waveform and the second probed waveform. Ascertaining the estimate of the first signal from the first probed waveform and the second probed waveform comprises: the measurement instrument delaying the second probed waveform by a processing delay equal to the time delay, to produce a delayed second probed waveform; and the measurement instrument subtracting the delayed second probed waveform from the first probed waveform to produce a difference signal; and the measurement instrument integrating the difference signal to produce the estimate of the first signal.

In some embodiments, the first signal and the second signal are both digital signals.

In some versions of these embodiments, the method further comprises the time delay is less than about ⅓ of a rise time of at least one of first signal and the second signal.

In some embodiments, ascertaining the estimate of the second signal from the first probed waveform and the second probed waveform comprises subtracting the estimate of the first signal from the first probed waveform.

In some embodiments, ascertaining the estimate of the second signal from the first probed waveform and the second probed waveform comprises: the measurement instrument delaying the first probed waveform by a processing delay equal to the time delay, to produce a delayed first probed waveform; the measurement instrument subtracting the delayed first probed waveform from the second probed waveform to produce a second difference signal; and the measurement instrument integrating the second difference signal to produce the estimate of the second signal.

In some embodiments, the measurement instrument is an oscilloscope comprising: two probe inputs for receiving the first and second probed waveforms from a first probe and a second probe, respectively.

In some versions of these embodiments, the method further comprises: a processor configured to process the first and second probed waveforms; and a display configured to display an output signal of the oscilloscope.

In some versions of these embodiments, the method further comprises calibrating a difference between the first probe and the second probe.

BRIEF DESCRIPTION OF THE DRAWINGS

The example embodiments are best understood from the following detailed description when read with the accompanying drawing figures. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 1A:
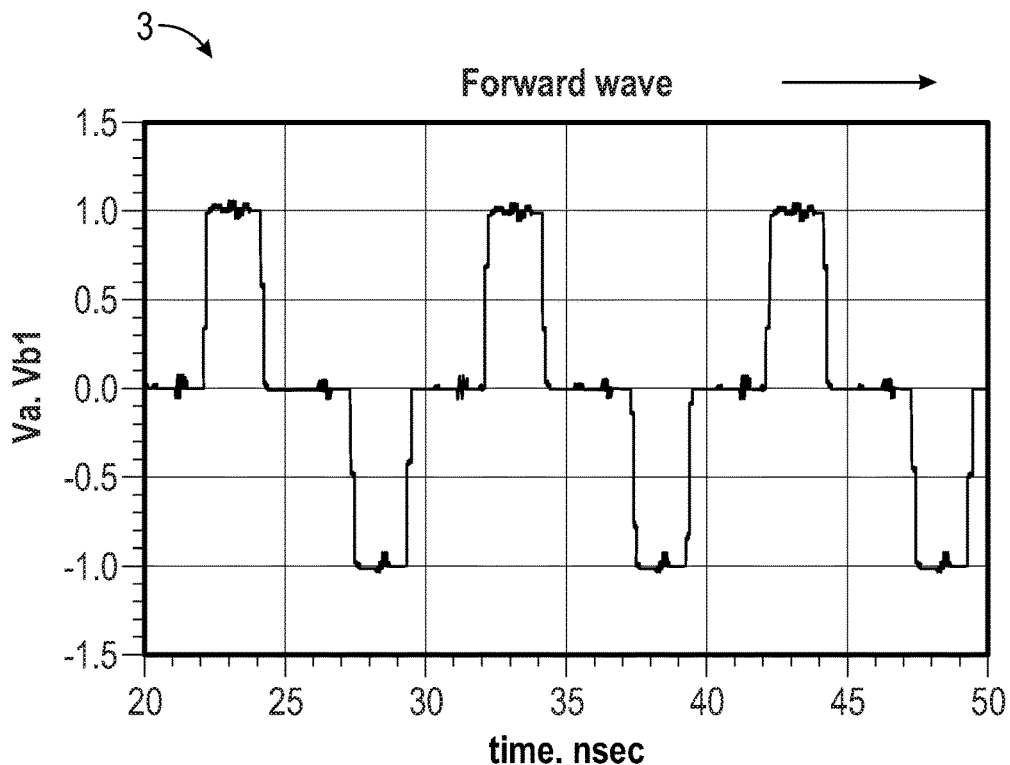
FIGS. 1A, 1B and 1C illustrate forward (incident) and reverse (reflected) waves propagating between a memory controller and a memory device along a signal line.
Figure 1B:
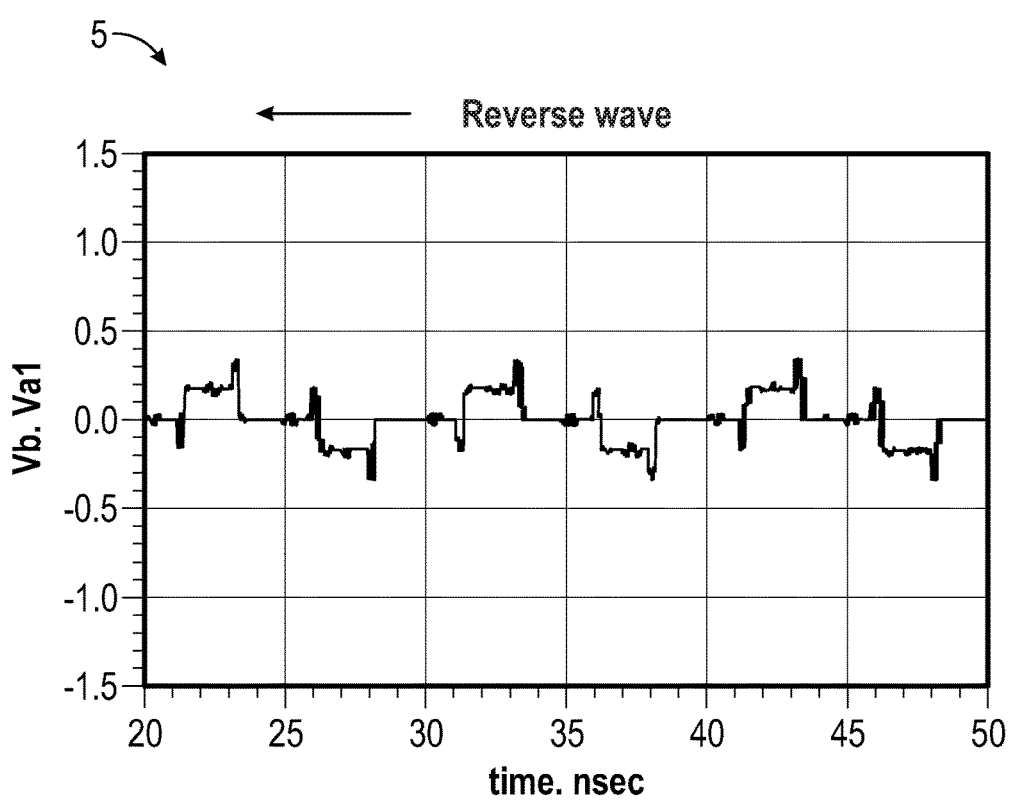
Figure 1C:
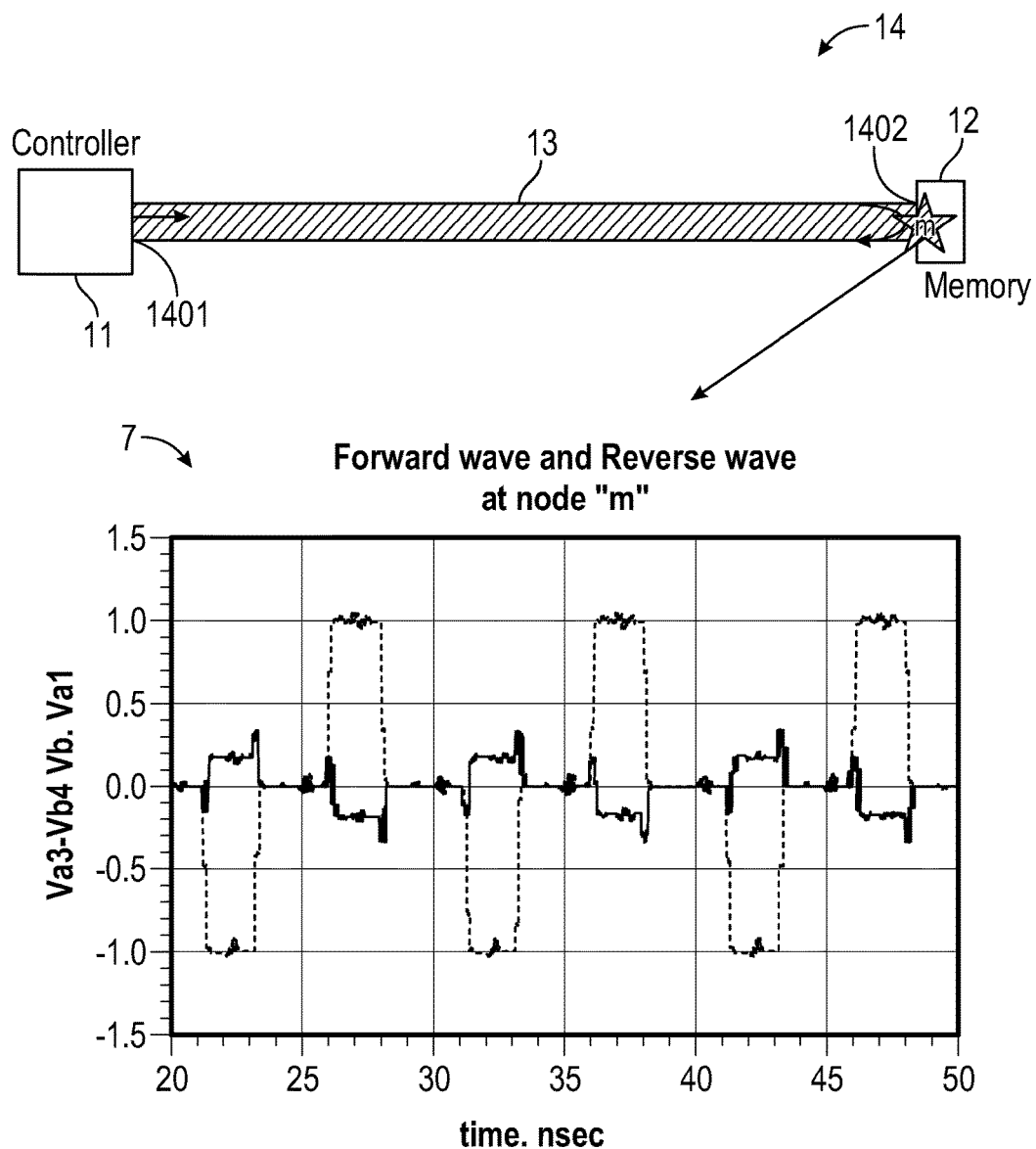

FIG. 1 illustrates an incident signal 3 and a reflected signal 5 propagating between a source device (here, a memory controller 11) and a destination device (here, a memory device 12) along a signal line 13 in a circuit 14 which may be included in a device such as a memory system. Hereafter, the term "incident signal" will be used synonymously with incident wave, forward wave, and forward signal. Similarly, the term "reflected signal" will be used synonymously with reflected wave, reverse wave, and reverse signal.

Here, incident signal 3 proceeds along signal line 13 from an output 1401 of memory controller 11 to an input 1402 (also referred to here as node m) of memory device 12, and reflected signal 5 proceeds along signal line 13 from the input 1402 (node m) of memory device 12 to the output 1401 of memory controller 11. FIG. 1 also shows a combination signal 7 of incident signal 3 and reflected signal 5 as they appear at the input 1402 (node m) of memory device 12.

To determine the reflection coefficient at the input 1402 (node m) of memory device 12, it is desired to be able to measure reflected signal 5 and incident signal 3 at the input 1402 (node m) of memory device 12, and to take the ratio of the signals, as will be explained in further detail below.

Figure 2:
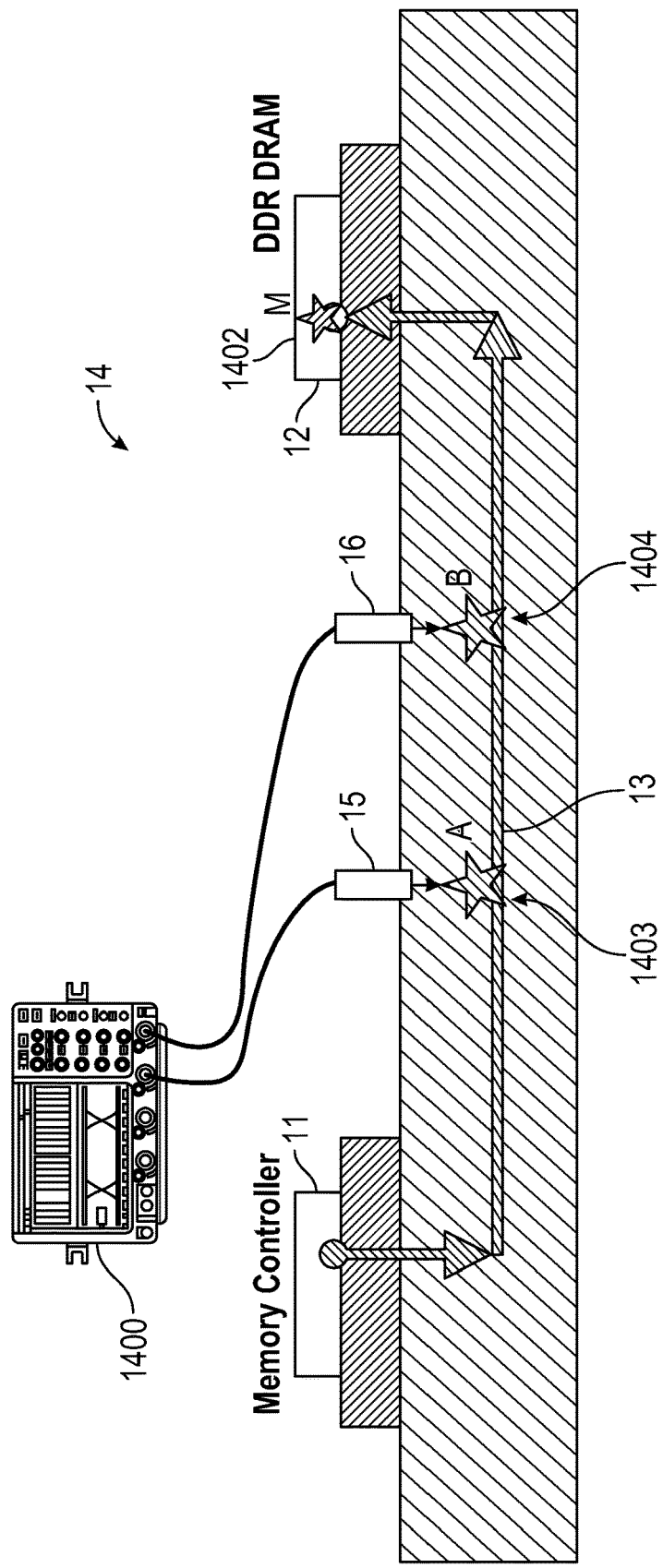
FIG. 2 illustrates an example of a measurement instrument probing a signal line between a memory controller and a memory device at two different locations along the signal line.

FIG. 2 illustrates an example of a measurement instrument 1400 probing signal line 13 between memory controller 11 and memory device at two different locations along signal line 13. Here, the measurement instrument 1400 may be a digital oscilloscope, an example of which will be described in greater detail below with respect to FIG. 14.

As shown in FIG. 2, measurement instrument 1400 receives at measurement instrument 1400 a first probed waveform which is probed via a probe 15 at a first location A 1403 on signal line 13 between a source device (memory controller 11) and a destination device (memory device 12) while output 1401 of the source device (memory controller 11) sends an incident signal (e.g., a WRITE command or WRITE data) to input 1402 of the destination device (memory device 12) via signal line 13.

Measurement instrument 1400 also receives a second probed waveform probed via a probe 15 at a second location B 1404 on signal line 13 while output 1401 of source device (memory controller 11) sends the incident signal to input 1402 of the destination device (memory device 12) via signal line 13. Here, second location B 1404 is separated and spaced apart from first location A 1403 by a separation distance. In some embodiments, the separation distance may be small, such as a distance that corresponds to less than the rise time, and even more beneficially less than ⅓ of the rise time, of a bit in incident signal 3.

Beneficially, probe 16 may be the same probe as probe 15 so that any errors due to mismatches of two different probes and the different signal processing paths of the probe inputs in measurement instrument 1400 are eliminated. In that case, measurement instrument 1400 may receive at a first probe input the first probed waveform which is probed via probe 15 at first location A 1403 on signal line 13 at a first time, and then probe 15 may be moved from location A 1403 to location B 1404, and measurement instrument 1400 may receive at the same first probe input the second probed waveform which is probed via probe 15 at second location B 1404 on signal line 13 at a second time. In that case, measurement instrument 1400 may time align the first and second waveforms of patterns using techniques which are commonly available in some measurement instruments, particularly digital oscilloscopes.

Figure 3:
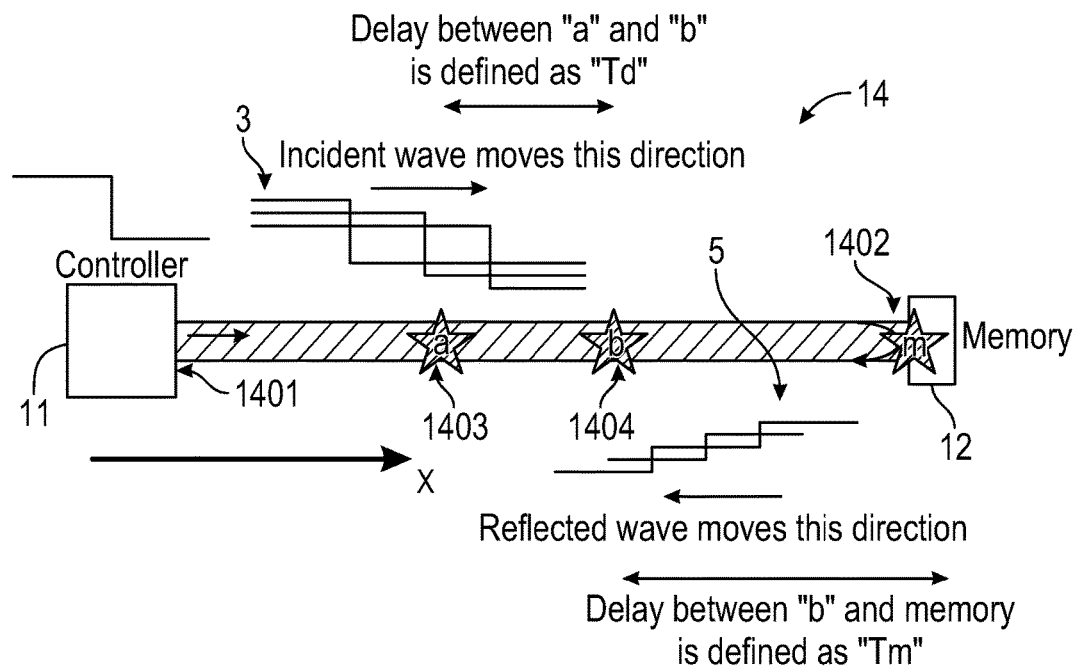
FIG. 3 illustrates the propagation of an incident wave along a signal line from a memory controller to a memory device and the propagation of a reflected wave along the signal line from the memory device to the memory controller.

FIG. 3 illustrates the propagation of incident signal 3 along signal line 13 from a source device (memory controller 11) to a destination device (memory device 12), and the propagation of reflected signal 5 along signal line 13 from memory device 12 to memory controller 11.

Here, incident signal 3 may be expressed as:

$$\Phi i(x-vt) \tag{1}$$

and reflected signal 5 may be expressed as:

$$\Phi r(x+vt). \tag{2}$$

It can be seen in FIG. 3 that the magnitude of reflected signal 5 is smaller, typically much smaller, than the magnitude of incident signal 3. This will be the case if, as is typically desired, the impedance of input 1402 of memory device 12 and the impedance of signal line 13 are well matched to the impedance of output 1401 of memory controller 11 at the operating frequencies of incident signal 3. The better that the impedances are matched, the less the magnitude of reflected signal 5 will be compared to the magnitude of incident signal 3.

It should also be noted that other reflection signals may in general be present on signal line 13. For example, a reverse reflected signal from output 1401 of memory controller 11 may be present on signal line 13. Furthermore, a second reflected signal from input 1402 of memory device 12, generated in response to the reverse reflected signal, may also be present on signal line 1. Many such reflected signals may be present on signal line 13. However, assuming (as it typically the case) that the impedance of input 1402 of memory device 12 and the impedance of signal line 13 are well matched to the impedance of output 1401 of memory controller 11 at the operating frequencies of incident signal 3, all of these additional signals will be at much reduced magnitudes compared to the magnitudes of incident signal 3 and reflected signal 5. Accordingly, the presence of these signals may be ignored without a significant effect on the accuracy of determining the reflection coefficient of input 1402 of memory device 12 using techniques described below.

Figure 4:
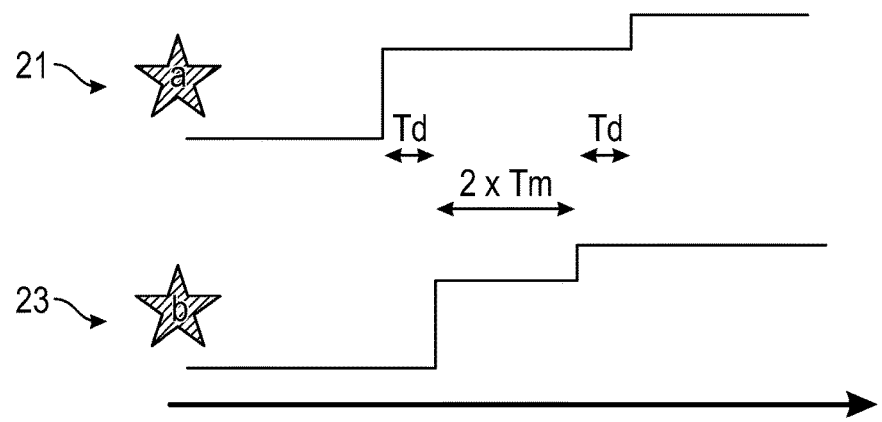
FIG. 4 illustrates an example of a first probed waveform which is probed at a first location on a signal line between a source device and a destination device while an output of the source device sends an incident signal to an input of the destination device via the signal line, and a second probed waveform probed at a second location on the signal line while the output of the source device sends the incident signal to the input of the destination device via the signal line.

FIG. 4 illustrates an example of a first probed waveform 21 which is probed at first location A 1403 on signal line 13 between a source device (memory controller 11) and a destination device (memory device) while output 1401 of memory controller 11 sends an incident signal to input 1402 of memory device 12 via signal line 13. FIG. 4 also shows an example of a second probed waveform 23 probed at second location B 1404 on signal line 13 while output 1401 of the memory controller 11 sends incident signal 3 to input 1402 of memory device 12 via signal line 13.

FIG. 4 illustrates a delay, Td, which represents a time it takes for incident signal 3 to propagate from first location A 1403 on signal line 13 to second location B 1404 on signal line 13, and conversely a time it takes for reflected signal 5 to propagate from second location B 1404 on signal line 13 to first location A 1403 on signal line 13. FIG. 4 also illustrates a delay, Tm, which represents a time it takes for incident signal 3 to propagate from second location B 1404 on signal line 13 to input node M 1402 of memory device 12 on signal line 13, and conversely a time it takes for reflected signal 5 to propagate from input node M 1402 of memory device 12 on signal line 13 to second location B 1404 on signal line 13. Here, the voltage V(a) of first probed waveform 21 at first location A 1403 may be expressed as:

$$V(a)=\Phi i(Xa-vt)+\Phi r(Xa+vt) \tag{3}$$

and the voltage V(b) of second probed waveform 23 at second location B 1404 may be expressed as:

$$V(b)=\Phi i(Xb-vt)+\Phi r(Xb+vt). \tag{4}$$

As explained above, first probed waveform 21 and second probed waveform 23 may be measured at different times that each other using a same probe 15 while output 1401 of the memory controller 11 sends the same incident signal 3 to input 1402 of memory device 12 via signal line 13.

Figure 5:
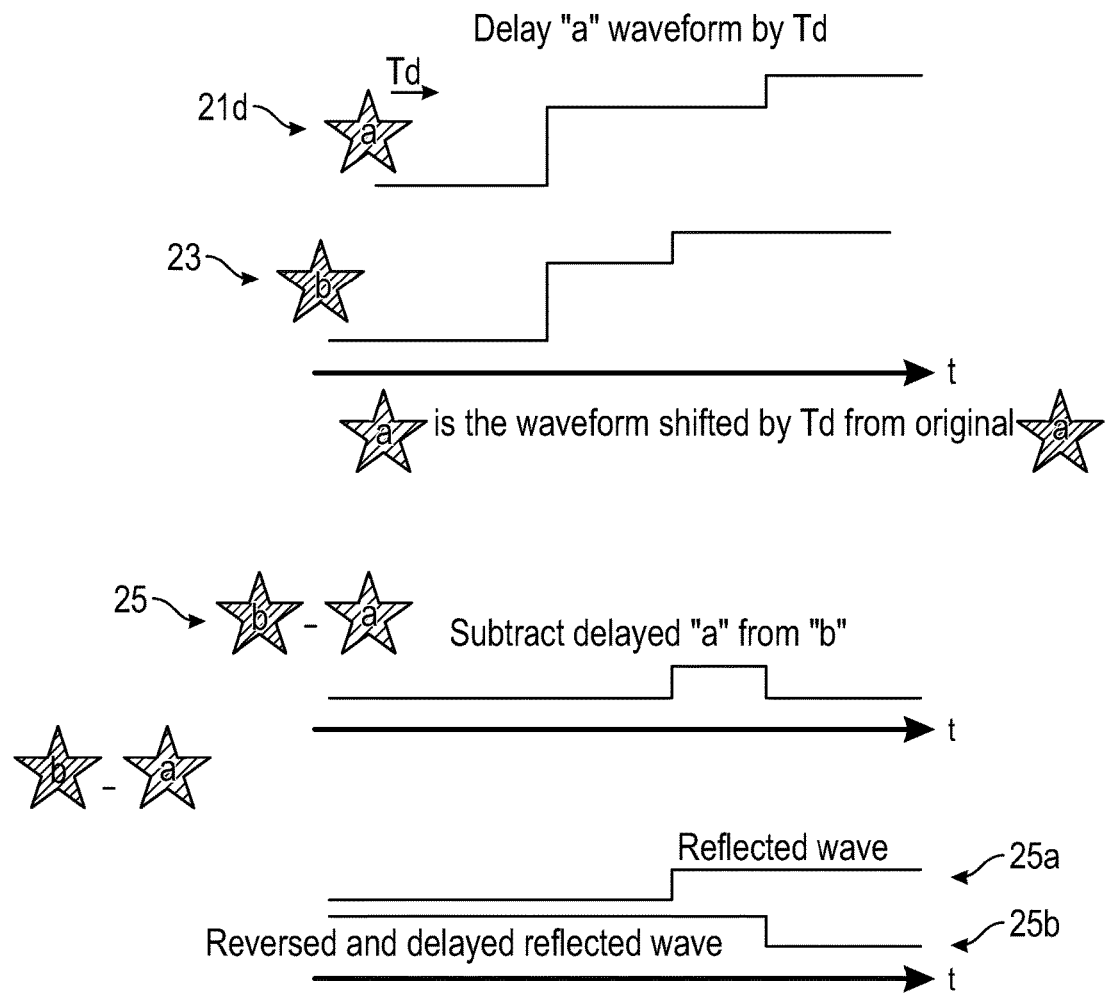
FIG. 5 illustrates how the reflected signal may be obtained from the first and second probed waveforms of FIG. 4.

FIG. 5 illustrates how reflected signal 5 may be obtained from first probed waveform 21 and second probed waveform 23 of FIG. 4.

In a first operation or step, first probed waveform 21 is delayed by a processing delay Td to produce a delayed first probed waveform 21d. Here, Td is the same delay as shown in FIG. 4 which represents a time it takes for incident signal 3 to propagate from first location A 1403 on signal line 13 to second location B 1404 on signal line 13, and conversely a time it takes for reflected signal 5 to propagate from second location B 1404 on signal line 13 to first location A 1403 on signal line 13.

Accordingly, the voltage (Xa) of delayed first probed waveform 21d may be expressed as:

$$\begin{aligned} V(Xa) &= \Phi i(Xa - v(t - Td)) + \Phi r(Xa + v(t - Td)) \\ &= \Phi i(Xb - vt) + \Phi r(Xb - vTd + vt). \end{aligned} \tag{5}$$

Here, measurement instrument 1400 may perform the delay of first probed waveform 21 by using a built-in function of measurement instrument 1400 which causes a processor belonging to, or associated with, measurement instrument 1400 to perform a software algorithm using processor instructions which are stored in a memory device (e.g., non-volatile memory) belonging to, or associated with, the processor.

In a next operation or step, measurement instrument subtracts delayed first probed waveform 21d from second probed waveform 23 to produce the voltage of the reflected signal, Vref as:

$$Vref=\Phi r(Xb+vt)-\Phi r(Xc+vt), \text{ where:}$$

$$Xc=Xa-vTd \tag{6}$$

Here, it may be assumed that the magnitude of incident signal 3 at first location A 1403 is approximately the same as the magnitude of incident signal 3 at second location B 1404, as the distance between first location A 1403 and second location B 1404 is small and the attenuation of incident signal 3 is therefore small or negligible.

As illustrated in FIG. 5, the waveform Vref is an overlap of two reflected waves: the original one from node M at input 1402 of memory device 12, and a delayed and reversed reflected wave.

Figure 6:
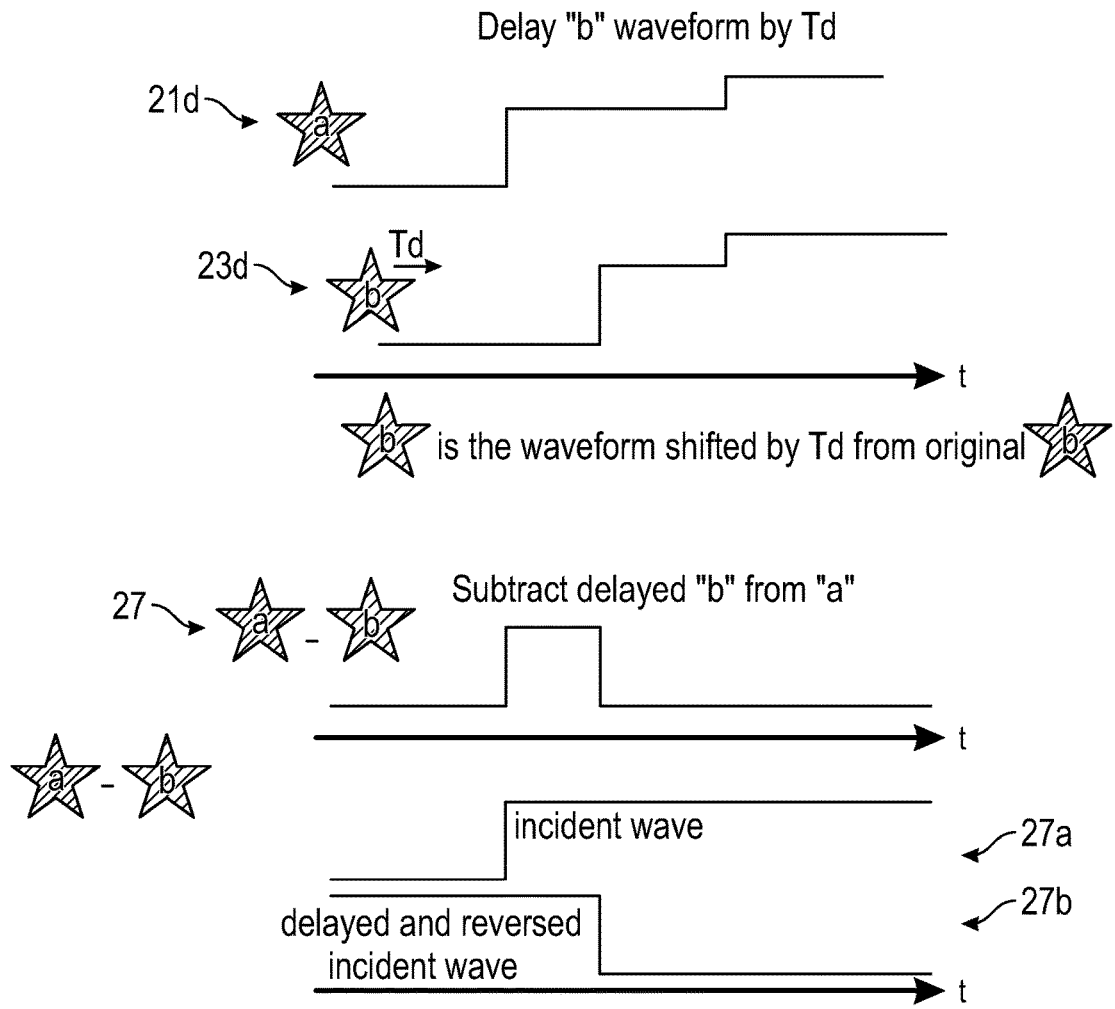
FIG. 6 illustrates how the incident signal may be obtained from the first and second probed waveforms of FIG. 4.

FIG. 6 illustrates how the incident signal may be obtained from the first and second probed waveforms of FIG. 4.

In a first operation or step, second probed waveform 23 is delayed by a processing delay Td to produce a delayed second probed waveform 23d. Here, Td is the same delay as shown in FIG. 4 which represents a time it takes for incident signal 3 to propagate from first location A 1403 on signal line 13 to second location B 1404 on signal line 13, and conversely a time it takes for reflected signal 5 to propagate from second location B 1404 on signal line 13 to first location A 1403 on signal line 13.

Accordingly, the voltage V(Xb) of delayed second probed waveform 23d may be expressed as:

$$V(Xb) = \Phi i(Xa - v(t - Td)) + \Phi r(Xa + v(t - Td)) \quad (5)$$
$$= \Phi i(Xb - vt) + \Phi r(Xb - vTd + vt).$$

Here, measurement instrument 1400 may perform the delay of second probed waveform 23 by using a built-in function of measurement instrument 1400 which causes a processor belonging to, or associated with, measurement instrument 1400 to perform a software algorithm using processor instructions which are stored in a memory device (e.g., non-volatile memory) belonging to, or associated with, the processor.

In a next operation or step, measurement instrument 1400 subtracts delayed second probed waveform 23d from first probed waveform 21 to produce the voltage of the incident signal, Vinc as:

$$Vinc = \Phi i(Xa-vt) - \Phi i(Xd-vt), \text{ where:}$$

$$Xd = Xb + vTd. \quad (6)$$

Here, it may be assumed that the magnitude of reflected signal 5 at first location A 1403 is approximately the same as the magnitude of reflected signal 5 at second location B 1404, as the distance between first location A 1403 and second location B 1404 is small and the attenuation of reflected signal 5 is therefore small or negligible.

As illustrated in FIG. 6, the waveform Vinc is an overlap of two incident waves: the original one from output 1401 of memory controller 11, and a delayed and reversed incident wave.

Figure 7:
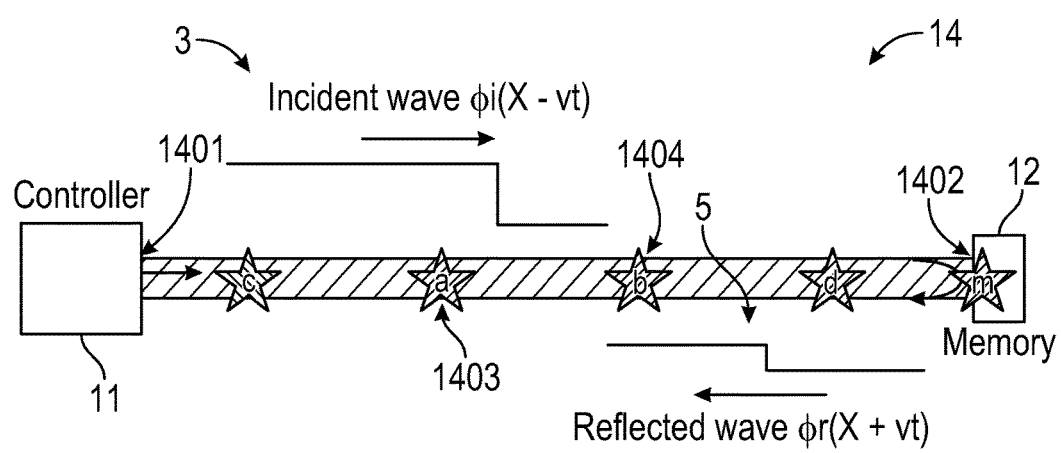
FIG. 7 illustrates examples of an incident signal and a reflected signal obtained through the steps illustrated in FIGS. 5 and 6.
Figure 7:
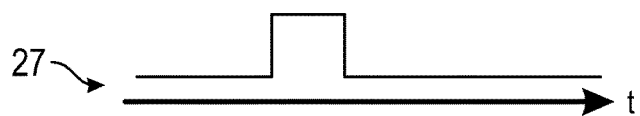
Figure 7:

FIG. 7 illustrates examples of an incident signal and a reflected signal which have been separated and captured separately through the steps illustrated in FIGS. 5 and 6.

As shown in FIG. 7, measurement instrument 1400 has been able to capture the incident wave and reflection wave separately by the procedures explained above with respect to FIGS. 5 and 6 as:

$$Vinc(t) = \Phi i(Xa-vt) - \Phi i(Xd-vt) \quad (7)$$

and $$Vref(t) = \Phi r(Xb+vt) - \Phi r(Xc+vt), \quad (8)$$

where "c" and "d" are the virtual locations on signal line 13 as shown in FIG. 7.

Figure 8:
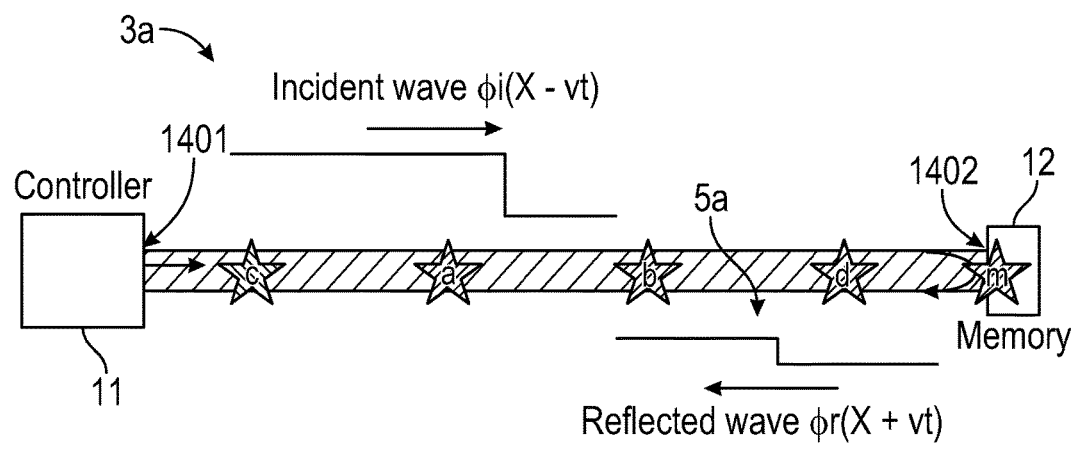
FIG. 8 illustrates how the incident and reflected signals of FIG. 7 appear at the input to the memory device from which the reflection coefficient of the input may be ascertained.
Figure 8:
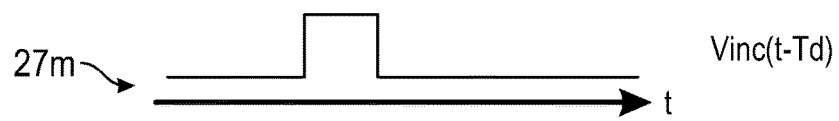
Figure 8:
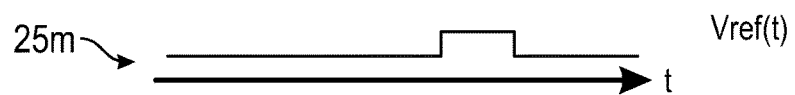

FIG. 8 illustrates how the incident signal 3 and reflected signal 5 of FIG. 7 appear at node M of signal line 13 (input 1402 of memory device 12) from which the reflection coefficient of input 1402 may be ascertained from the signals Vinc(t) and Vref(t) which have been separated and measured as explained above with respect to FIGS. 2-7.

In particular, measurement instrument 1400 may overlap time shifted Vinc and time-shifted Vref to determine the waveform at node M.

Because the distances along signal line 13 are small, and the corresponding attenuation of signals propagating along signal line 13 is small, Vinc(t−Td)+Vref(t) is expected to be the same as the waveform at node M with the delay Tm (Tm is the delay between second location B and node M), Vmem(t−Tm), as shown in FIG. 8.

Finally, the reflection coefficient at input 1402 of memory device 12 (i.e., at node M) can be found by: (1) measurement instrument 1400 determining the frequency response of incident signal 3 Vinc(t) at node M (i.e., input 1402 of the destination device (memory device 12); (2) measurement instrument 1400 determining the frequency response of the reflected signal 5 Vref(t) t node M (i.e., input 1402 of the destination device (memory device 12); and (3) measurement instrument 1400 dividing the frequency response of reflected signal 5 Vref(t) t node M (i.e., input 1402 of the destination device (memory device 12) by the frequency response of incident signal 3 Vinc(t) at node M (i.e., input 1402 of the destination device (memory device 12).

Figure 9A:
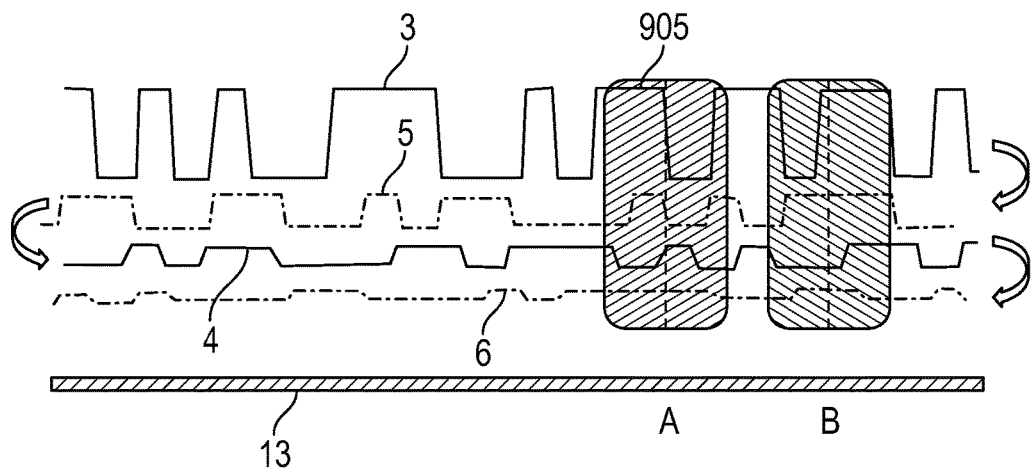
FIG. 9A and FIG. 9B illustrate how a waveform may be captured by a digital oscilloscope at two different locations on a signal line using different triggers such that the incident waveform is time aligned at the two different locations.
Figure 9B:
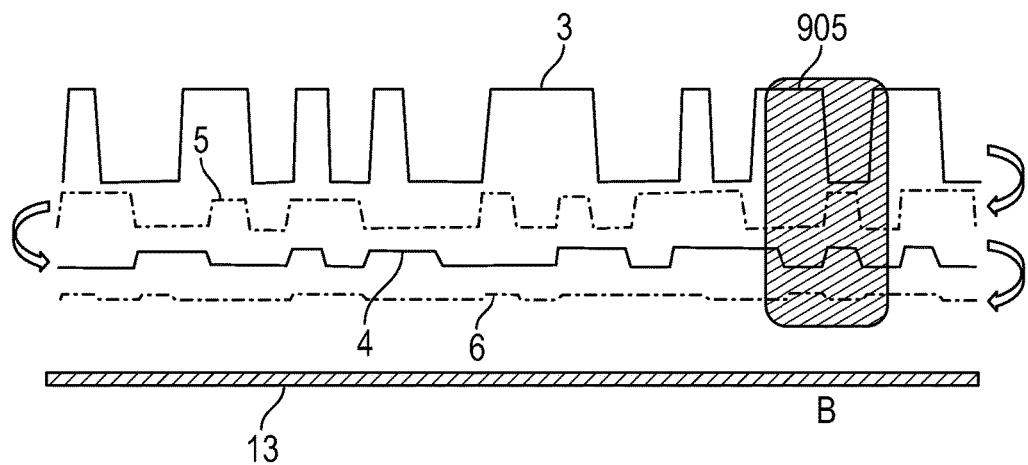

In some embodiments, the measurement instrument (e.g., a digital oscilloscope) may capture the incident signal and the reflected signal at the two different locations, i.e., a first location A and a second location B, as follows. First, as shown in FIG. 9A, the digital oscilloscope may capture a first probed waveform of the incident and reflected signals at first location A using a first trigger at a first time using a first channel (CH1) of the digital oscilloscope. An internal function of the digital oscilloscope may be used to find a target waveform 905 of the incident signal from the data captured for CH1. Then, as shown in FIG. 9B, the digital oscilloscope may capture a second probed waveform of the incident and reflected signals at second location B at a second time using a second channel (CH2) of the digital oscilloscope, using a second trigger selected such that the same target waveform 905 of the incident signal is aligned at second location B. It may be seen from the highlighted areas in FIGS. 9A and 9B that the incident signal 3 and the forward transmission signal 4 (which may be neglected) in the first probed waveform captured by CH1 of the digital oscilloscope at first location A using the first trigger, are the same as the incident signal 3 and forward transmission signal 4 in the second probed waveform captured by CH2 at second location B using the second trigger. However, the reflected signals 5 and 6 in the first probed waveform captured by CH1 at first location A are not the same as the reflected signals 5 and 6 in the second probed waveform captured by CH2 at second location B. Thus by performing a subtraction operation on the second probed waveform of CH2 at second location B and the first probed waveform of CH1 at first location A, incident signal 3 and forward transmission signal 4 may be canceled out, leaving only the reflection. A similar procedure may be applied to cancel out the reflected signals to obtain the incident signal 3.

In some embodiments, the time delay Δt (which sets the distance between first location A and second location B) may be set to between about 10% to 30% of a bit interval for the incident signal 3, particularly when it is assumed that the incident signal 3 approximates a pseudo random bit stream (PRBS) signal. In one example, when the data rate is 3 Gbps, then one bit interval is 333 ps. In that case, the time delay Δt from first location A to second location B may be set to about 33 ps. For a signal propagating in a medium with a dielectric constant of one, this would mean that the distance between first location A and second location B would be about 1 cm.

Figure 10:
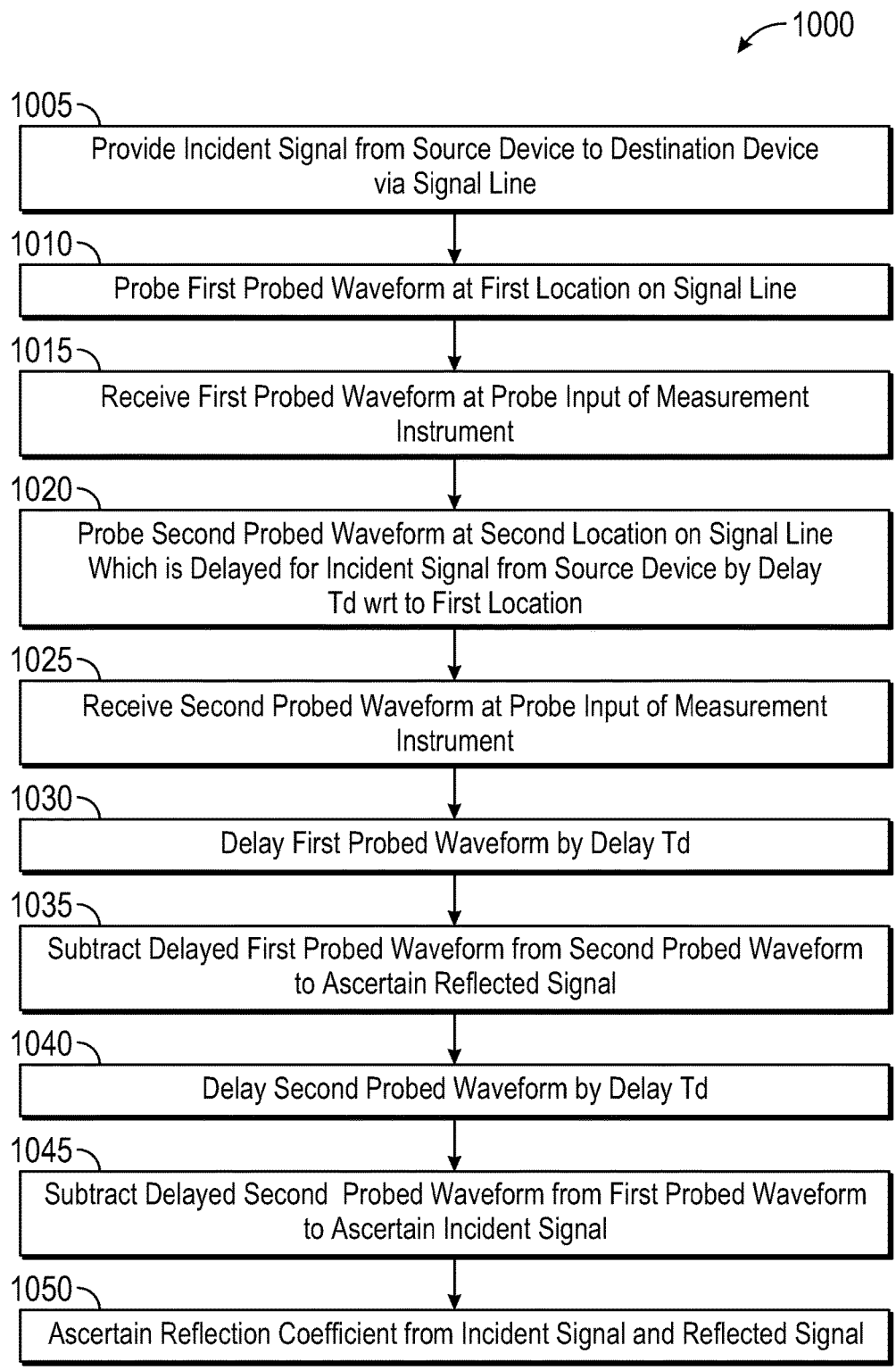
FIG. 10 is a flowchart of an example embodiment of a method of ascertaining the reflection coefficient at the input of the memory device.

FIG. 10 is a flowchart of an example embodiment of a method 1000 of ascertaining the reflection coefficient at an input of a destination device on a signal line, such as memory device 12 on signal line 13, as explained above.

In a first operation 1005, a source device (e.g., memory controller 11) provides an incident signal to a destination device (e.g., memory device 12) via a signal line (e.g., signal line 13).

In an operation 1010, a probe connected to a measurement instrument (e.g., measurement instrument 1400) probes a first probed waveform (e.g., first probed waveform 21) at a first location (e.g., first location A 1403) on signal line 13. Here it may be understood that probing involves contacting or sensing signal line 13 with a high impedance probe having an impedance that is much greater (e.g., many orders of magnitude greater) than the impedances of signal line 13, output 1401 of the source device (e.g., memory controller 11) and input 1402 of the destination device (e.g., memory device 12). Such probing may be referred to as non-disturbing probing as the nature of the probing does not disturb, or only negligibly disturbs, the waveform(s) as they would appear in signal line 13 in the absence of the probe. Thus probing as used herein should be distinguished from coupling a waveform from signal line 13 through the use of a device such as a directional coupler, power splitter, etc.

In an operation 1015, measurement instrument 1400 receives the first probed waveform at a probe input (which may be one of many probe inputs) of measurement instrument 1400.

In an operation 1020, a probe connected to measurement instrument 1400 probes a second probed waveform (e.g., second probed waveform 23) at a second location (e.g., second location B 1404) on signal line 13. Here, second location B 1404 is separated and spaced apart from first location A 1403 by a separation distance which delays an incident signal (e.g., incident signal 3) on signal line 13 by a delay Td as it propagates from first location A 1403 to second location B 1404.

In an operation 1025, measurement instrument 1400 receives the second probed waveform at a probe input.

Beneficially, the probe used in operation 1020 is the same as the probe used in operation 1010, and the probe input used in operation 1025 is the same as the probe input used in operation 1015 to minimize or eliminate any differences between probes and probe inputs. However, it is also possible that a first probe is used in operation 1020 is different than a second probe used in operation 1010, and a first probe input used in operation 1025 is different than a second probe input used in operation 1015, perhaps with some reduction in accuracy.

In an operation 1030, measurement instrument 1400 delays the first probed waveform by a delay Td, as described above with respect to FIG. 5.

In an operation 1035, measurement instrument 1400 subtracts the delayed first probed waveform from the second probed waveform to ascertain or determine the reflected signal on signal line 13, as described above with respect to FIG. 5.

In an operation 1040, measurement instrument 1400 delays the second probed waveform by a delay Td, as described above with respect to FIG. 6.

In an operation 1045, measurement instrument 1400 subtracts the delayed second probed waveform from the first probed waveform to ascertain or determine the incident signal on signal line 13, as described above with respect to FIG. 6.

In an operation 1050, measurement instrument 1400 ascertains or determines the reflection coefficient at the input of the destination device from the incident signal and the reflected signal, as explained above with respect to FIGS. 7 and 8.

It should also be understood that in other embodiments, operations 1040-1045 for obtaining the incident signal may be performed prior to operations 1030-1035 for obtaining the reflected signal. Or where measurement instrument 1400 has the processing ability, operations 1030-1035 may be performed in parallel with operations 1040-1045. So the order of these operations illustrated in FIG. 10 is only one example.

Figure 11A:
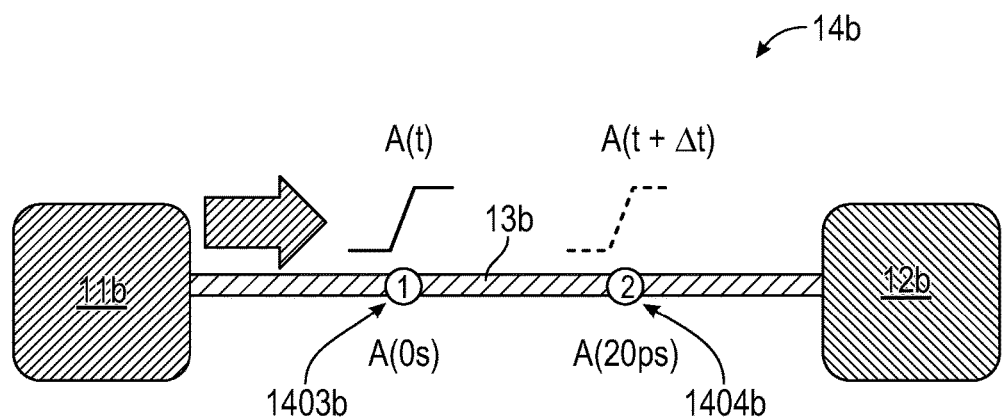
FIGS. 11A and 11B illustrate first and second signals propagating between a first device and a second device along a signal line.
Figure 11B:
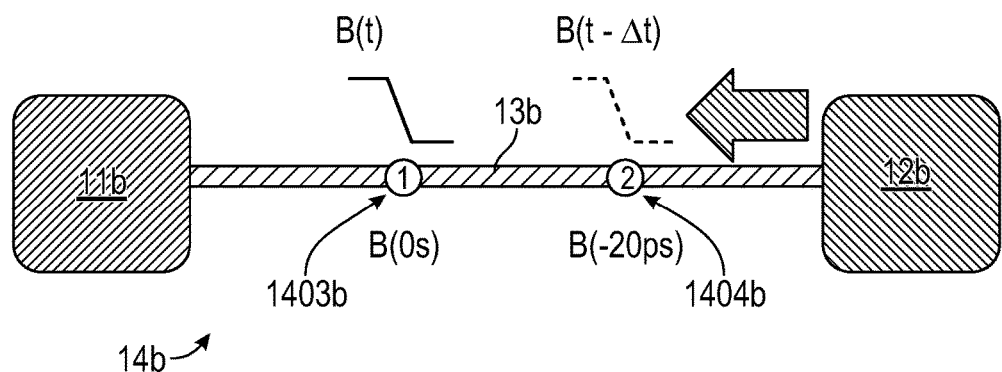

FIG. 11 illustrates a first signal and a second signal propagating between a first device 11b and a second device 12b along a signal line 13b in a circuit 14b.

Here the first signal is referred to as signal A, and is observed as A(t) at a first location 1403b on signal line 13b at a time t, and is observed as A(t+Δt) at a time (t+Δt) at a second location 1404b on signal line 13b which is separated and spaced apart from first location 1403b. The second signal is referred to as signal B, and is seen as B(t) at first location 1403b on signal line 13b and B(t−Δt) at second location 1404b on signal line 13b. First signal A is output from first device 11b, for example from an input/output port of first device 11b, and received by second device 12b, for example at an input/output port of first device 11b. At the same time as first signal A is output from first device 11b, second signal B is output from second device 12b. Such an arrangement is commonly referred to as full-duplex transmission or communication.

Beneficially, the distance between first location 1403b and second location 1404b is selected such that the time that it takes for first signal A to propagate from first location 1403b to second location 1404b, and the time that it takes for second signal B to propagate from second location 1404b to first location 1403b, is less than ⅓ of the rise time of first and second signals A and B. In some embodiments, depending on the rise time of the first and second signals A and B, the distance between first location 1403b and second location 1404b is such that first signal A takes less than 100 ps to propagate from first location 1403b to second location 1404b, and second signal B takes 100 ps to propagate from second location 1404b to first location 1403b. In the example illustrated in FIG. 10, the distance between first location 1403b and second location 1404b is such that first signal A takes 20 ps to propagate from first location 1403b to second location 1404b, and second signal B takes 20 ps to propagate from second location 1404b to first location 1403b. In other embodiments where the rise time of signals A and B is even shorter, the distance between first location 1403b and second location 1404b may be such that first signal A takes less than 20 ps to propagate from first location 1403b to second location 1404b, and second signal B takes less than 20 ps to propagate from second location 1404b to first location 1403b.

Figure 12:
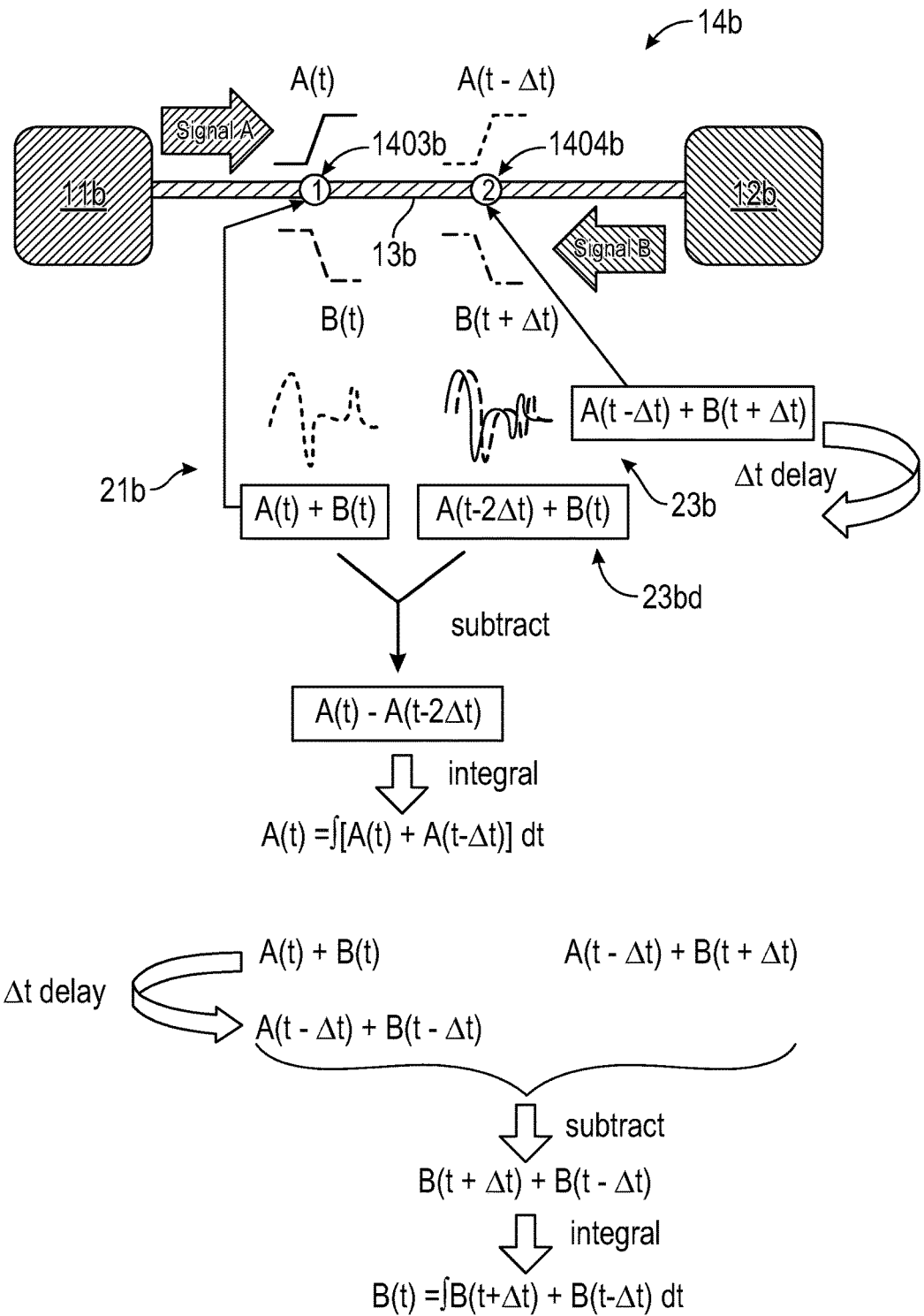
FIG. 12 how an estimate of the first signal may be obtained from first and second probed waveforms at first and second probed locations along the signal line.

FIG. 12 how an estimate of the first signal A may be obtained from first and second probed waveforms at first and second probed locations along the signal line.

In particular, in FIG. 12 a measurement instrument (such as measurement instrument 1400) may receive a first probed waveform 21b which is probed at first location 1403b, and may also receive a second probed waveform 23b which is probed at second location 1404b. Here first probed waveform 21b may be expressed as:

$$A(t)+B(t) \quad (9)$$

and second probed waveform 23b may be expressed as:

$$A(t-\Delta t)+B(t+\Delta t) \quad (10)$$

In this case, waveforms 21b and 23b are observed at the same time using two different probes.

Measurement instrument 1400 delays second probed waveform 23b by a delay $\Delta t$, where $\Delta t$ is the time that first signal A takes to propagate from first location 1403b to second location 1404b given the distance between first location 1403b and second location 1404b, and the time that second signal B takes to propagate from second location 1404b to first location 1403b. Delaying second probed waveform 23b by the delay $\Delta t$ produces a delayed second probed waveform 23bd which may be expressed as:

$$A(t-2\Delta t)+B(t) \quad (11)$$

Measurement instrument 1400 may perform the delay of second probed waveform 23b by using a built-in function of measurement instrument 1400 which causes a processor belonging to, or associated with, measurement instrument 1400 to perform a software algorithm using processor instructions which are stored in a memory device (e.g., non-volatile memory) belonging to, or associated with, the processor.

Measurement instrument 1400 subtracts delayed second probed waveform 23bd from first probed waveform 21b to produce a difference signal which may be expressed as:

$$A(t)-A(t-2\Delta t) \quad (12)$$

Measurement instrument 1400 may then ascertain or determine an estimate of first signal A as:

$$A(t)=\int [A(t)-\Delta t)]dt \quad (13)$$

Measurement instrument 1400 may then obtain an estimate of second signal B by subtracting the first signal A from first probed waveform 21b. Alternatively, measurement instrument 1400 may then obtain an estimate of second signal B by: delaying first probed waveform 21b; subtracting the delayed first probed waveform from the second probed waveform 23b to produce a difference signal; and integrating the difference signal, as illustrated in FIG. 12.

Figure 13:
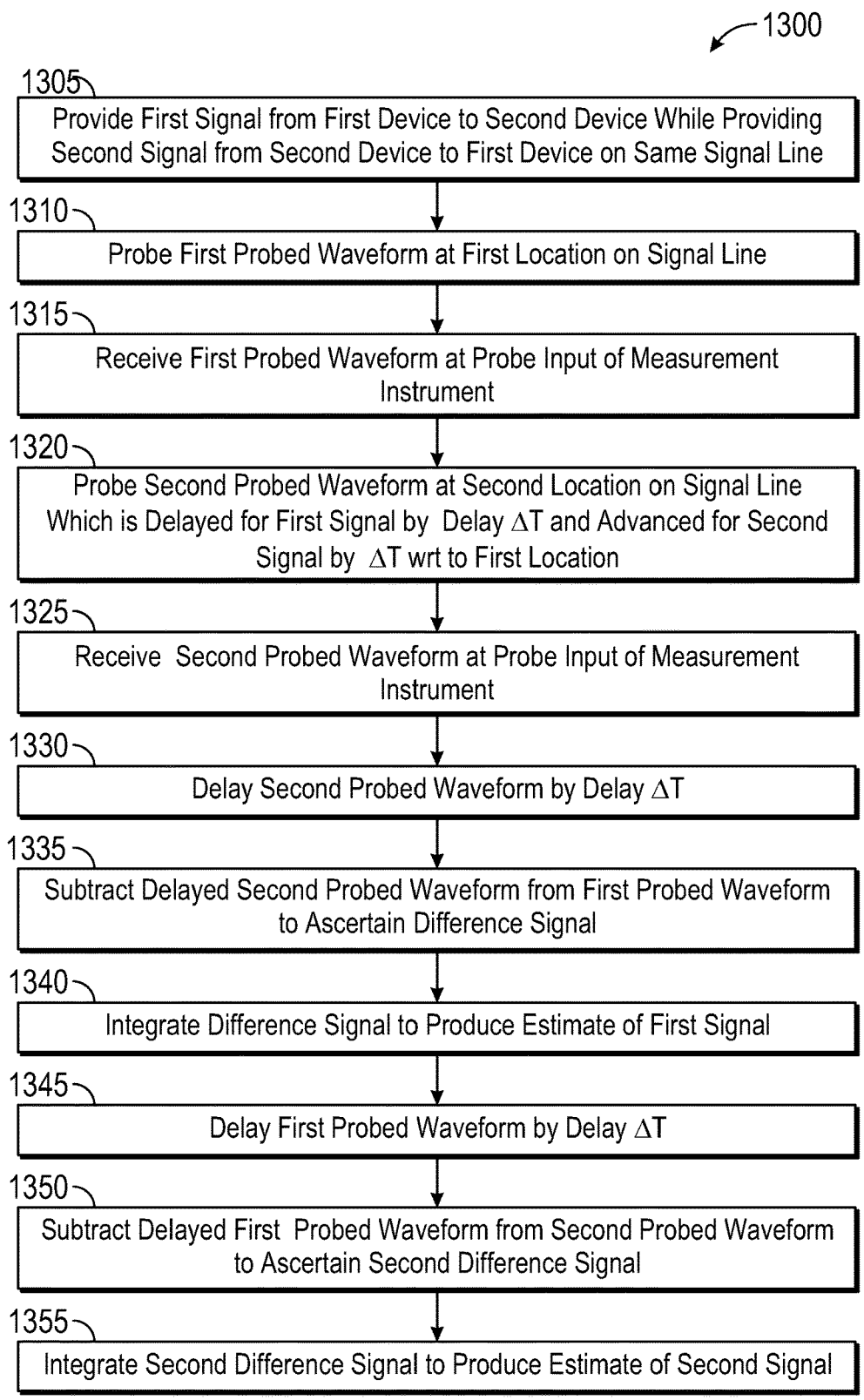
FIG. 13 is a flowchart of an example embodiment of a method of obtaining estimates of a first signal and a second signal propagating in opposite directions at the same time along a signal line between a first device and a second device.

FIG. 13 is a flowchart of an example embodiment of a method 1300 of obtaining estimates of a first signal and a second signal propagating in opposite directions at the same time along a signal line between a first device and a second device.

In a first operation 1305, a first device (e.g., first device 11b) provides a first signal (e.g., first signal A) to a second device (e.g., second device 12b) via a signal line (e.g., signal line 13b) at the same time that the second device provide a second signal (e.g., second signal B) to the first device via the same signal line.

In an operation 1310, a first probe connected to a measurement instrument (e.g., measurement instrument 1400) probes a first probed waveform (e.g., first probed waveform 21) at a first location (e.g., first location 1403b) on signal line 13b. Here it may be understood that probing involves contacting or sensing signal line 13 with a high impedance probe having an impedance that is much greater (e.g., many orders of magnitude greater) than the impedances of signal line 13b, the input/output of first device 11b, and the input/output of the second device 12b. Such probing may be referred to as non-disturbing probing as the nature of the probing does not disturb, or only negligibly disturbs, the waveform(s) as they would appear in signal line 13b in the absence of the probe. Thus probing as used herein should be distinguished from coupling a waveform from signal line 13b through the use of a device such as a directional coupler, power splitter, etc.

In an operation 1315, measurement instrument 1400 receives the first probed waveform at a first probe input (which may be one of many probe inputs) of measurement instrument 1400.

In an operation 1320, a second probe connected to measurement instrument 1400 probes a second probed waveform (e.g., second probed waveform 23b) at a second location (e.g., second location B 1404b) on signal line 13b. Here, second location 1404b is separated and spaced apart from first location 1403b by a separation distance such that first signal A takes less a delay $\Delta t$ to propagate from first location 1403b to second location 1404b, and second signal B takes the same delay $\Delta t$ to propagate from second location 1404b to first location 1403b, as explained above with reference to FIGS. 10 and 11.

In an operation 1325, measurement instrument 1400 receives the second probed waveform at a second probe input.

Here, it should be understood that operations 1305, 1310, 1315, 1320 and 1325 may occur during a same time. More specifically, it is understood that the first probe probes signal line 13b at first location 1403b at the same time that the second probe probes signal line 13b at second location 1404b.

In an operation 1330, measurement instrument 1400 delays the second probed waveform by a delay $\Delta t$, as described above with respect to FIG. 12.

In an operation 1335, measurement instrument 1400 subtracts the delayed second probed waveform from the first probed waveform to ascertain or determine a first difference signal, as described above with respect to FIG. 12.

In an operation 1340, measurement instrument 1400 integrates the first difference signal to obtain an estimate of the first signal A, as described above with respect to FIG. 12.

In an operation 1345, measurement instrument 1400 delays the second probed waveform by a delay $\Delta t$, as described above with respect to FIG. 12.

In an operation 1350, measurement instrument 1400 subtracts the delayed first probed waveform from the second probed waveform, as described above with respect to FIG. 12.

In an operation 1355, measurement instrument 1400 integrates the first difference signal to obtain an estimate of the second signal B, as described above with respect to FIG. 12.

In place of operations 1345, 1350 and 1355, other techniques may be employed to ascertain or determine the estimate of second signal B once the estimate of first signal A has already been obtained. It should also be understood that in other embodiments, the estimate of second signal B may be obtained first and then the estimate of first signal A may be obtained based on that.

Figure 14:
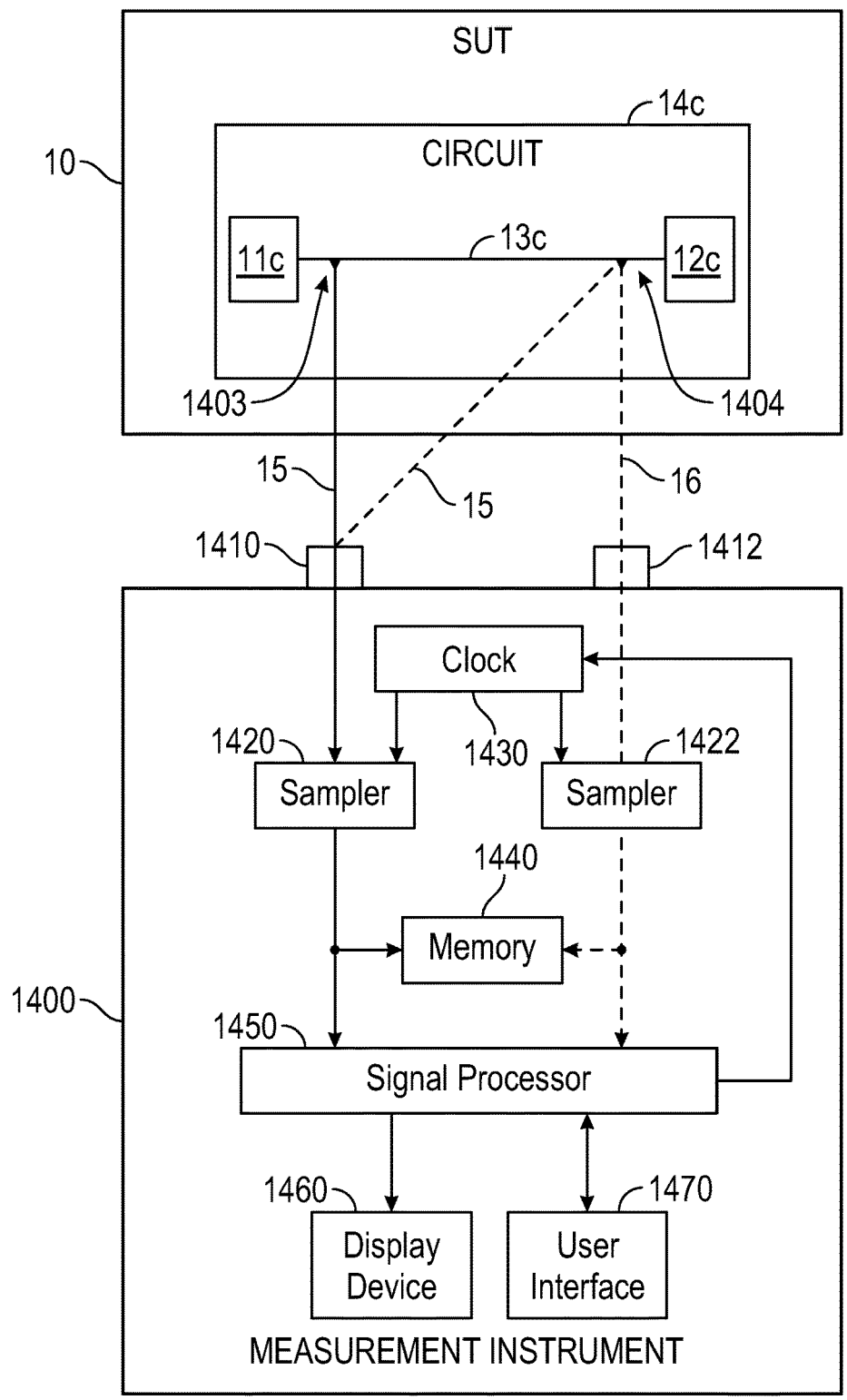
FIG. 14 is a simplified block diagram of one example embodiment of a measurement instrument which may be used to measure two signals which are simultaneously present on a signal line in a circuit of a system under test (SUT), and/or to measure the reflection coefficient of an input or output of a first device connected to second device via a signal line of the SUT, according to one or more methods described above.

FIG. 14 is a simplified block diagram of one example embodiment of a measurement instrument 1400 which may be used to measure two signals which are simultaneously present on a signal line 13c in a circuit 14c of a system under test (SUT) 10, and/or to measure the reflection coefficient of an input or output of a destination device (e.g., device 12c)

which receives an incident signal from a source device (e.g., device 11c) via signal line 13c, according to one or more methods described above.

In some embodiments, measurement instrument 1400 may be a digital oscilloscope.

Measurement instrument 1400 may include: a first probe input 1410 configured to receive (e.g., via a first probe 15) a first probed waveform from first location 1403 on signal line 13c; a first sampler 1420 configured to capture samples of received first probed waveform; a second probe input 1412 configured to receive (e.g., via a second probe 16) a second probed waveform from second location 1404 on signal line 13c; a second sampler 1422 configured to capture samples of the received second probed waveform; and a signal processor 1450.

As explained above, especially for an example when measurement instrument 1400 is being employed to determine a reflection coefficient at an input of a destination device (e.g., device 12c), first probe 15 and first probe input 1410 may be used to obtain both the first probed waveform and the second probed waveform. On the other hand, when measurement instrument 1400 is being employed to measure and/or display two different signals on signal line 13c transmitted separately in opposite directions by a first device (e.g., device 11c) and a second device (e.g., device 12c), then first probe 15 and first probe input 1410 may be used to obtain the first probed waveform, and second probe 16 and second probe input 1412 may be used to obtain the second probed waveform. Alternative signal paths are illustrated by dashed lines in FIG. 14.

Here, for simplicity, measurement instrument is shown having only two probe inputs where first probe input 1410 may receive either the first probed waveform or the second probed waveform from signal line 13c of circuit 14 of SUT 10. However, in general measurement instrument 1400 may have more that two probe inputs.

In some embodiments, each of first sampler 1420 and second sampler 1422 may include an analog-to-digital converter (ADC) which may be clocked in response to a clock 1430 of measurement instrument 1400. In some embodiments, clock 1430 may be recovered from the captured samples of received first or second probed waveforms by any of many clock recovery techniques known to those skilled in the art.

Measurement instrument 1400 may include a display device 1460 and a user interface 1470. Display device 1460 may include a liquid crystal display (LCD), a plasma display, a cathode ray tube (CRT), etc. User interface 1470 may include one or more of: a keyboard, a keypad, control knobs, a mouse, a trackball, buttons, indicator lights, etc., and associated processor and software for implementing user interface 370.

Measurement instrument 1400 may include memory 1440 which may store therein samples of first and second probed waveforms, and/or intermediate data produced in operations of signal processor 1450. Memory 1440 may be nonvolatile memory (e.g., random access memory), but it may also include non-volatile memory (e.g., read only memory; FLASH memory, etc.) for storing therein instructions to be executed by a processor of signal processor 1450, for example for performing operations described above with respect to FIGS. 4-13. The communication interface for measurement instrument 1400 may be any suitable interface, for example conforming to standards such as Ethernet, specialized test instrument standards, etc. In some embodiments, the communication interface may allow measurement instrument 1400 to communicate commands and data with one or more external computers and/or other measurement instruments via the Internet.

Measurement instrument 1400 may include other components and subsystems not illustrated in FIG. 14 so as not to obscure features of measurement instrument 1400 described herein for performing operations as described above with respect to FIGS. 4-13.

While example embodiments are disclosed herein, one of ordinary skill in the art appreciates that many variations that are in accordance with the present teachings are possible and remain within the scope of the appended claims. The invention therefore is not to be restricted except within the scope of the appended claims.

The invention claimed is:

1. A method, comprising:
receiving at a measurement instrument a first probed waveform which is probed at a first location on a signal line between a source device and a destination device while an output of the source device sends an incident signal to an input of the destination device via the signal line;
receiving at the measurement instrument a second probed waveform probed at a second location on the signal line while the output of the source device sends the incident signal to the input of the destination device via the signal line, wherein the second location is separated and spaced apart from the first location by a separation distance, wherein the separation distance produces a time delay for the incident signal to propagate from the first location to the second location; and
the measurement instrument ascertaining from the first probed waveform and the second probed waveform a reflection coefficient at the input of the destination device.

2. The method of claim 1, wherein ascertaining from the first probed waveform and the second probed waveform the reflection coefficient at the input of the destination device comprises:
the measurement instrument delaying the first probed waveform by a processing delay equal to the time delay, to produce a delayed first probed waveform; and
the measurement instrument subtracting the delayed first probed waveform from the second probed waveform to produce a reflected signal from the input of the destination device.

3. The method of claim 2, wherein ascertaining from the first probed waveform and the second probed waveform the reflection coefficient at the input of the destination device further comprises:
the measurement instrument delaying the second probed waveform by the processing delay equal to the time delay, to produce a delayed second probed waveform; and
the measurement instrument subtracting the delayed second probed waveform from the first probed waveform to produce the incident signal from the output of the source device.

4. The method of claim 3, wherein ascertaining from the first probed waveform and the second probed waveform the reflection coefficient at the input of the destination device further comprises:
the measurement instrument determining the incident signal at the input of the destination device;
the measurement instrument determining the reflected signal at the input of the destination device;

the measurement instrument determining a frequency response of the incident signal at the input of the destination device;

the measurement instrument determining a frequency response of the reflected signal at the input of the destination device; and the measurement instrument determining the reflection coefficient at the input of the destination device by dividing the frequency response of the reflected signal at the input of the destination device by the frequency response of the incident signal at the input of the destination device.

5. The method of claim 4, wherein the measurement instrument is an oscilloscope comprising one or more probe inputs for receiving the first and second probed waveforms, a processor configured to process the first and second probed waveforms, and a display configured to display an output signal of the oscilloscope.

6. The method of claim 5, wherein the first probed waveform which is probed at the first location on the signal line and the second probed waveform probed at the second location on the signal line are both provided to a same probe input among the one or more probe inputs via a single probe.

7. A measurement instrument, comprising:

one or more probe inputs configured to receive a first probed waveform which is probed at a first location on a signal line between a source device and a destination device while an output of the source device sends an incident signal to an input of the destination device via the signal line, and further configured to receive a second probed waveform probed at a second location on the signal line while the output of the source device sends the incident signal to the input of the destination device via the signal line, wherein the second location is separated and spaced apart from the first location by a separation distance, wherein the separation distance produces a time delay for the incident signal to propagate from the first location to the second location; and a processor which is configured to ascertain from the first probed waveform and the second probed waveform a reflection coefficient at the input of the destination device.

8. The measurement instrument of claim 7, wherein the processor is configured to ascertain from the first probed waveform and the second probed waveform the reflection coefficient at the input of the destination device by:

causing the measurement instrument to delay the first probed waveform by a processing delay equal to the time delay, to produce a delayed first probed waveform; and subtracting the delayed first probed waveform from the second probed waveform to produce a reflected signal from the input of the destination device.

9. The measurement instrument of claim 8, wherein the processor is configured to ascertain from the first probed waveform and the second probed waveform the reflection coefficient at the input of the destination device by:

causing the measurement instrument to delay the second probed waveform by the processing delay equal to the time delay, to produce a delayed second probed waveform; and subtracting the delayed second probed waveform from the first probed waveform to produce the incident signal.

10. The measurement instrument of claim 9, wherein the processor is configured to ascertain from the first probed waveform and the second probed waveform the reflection coefficient at the input of the destination device by:

determining the incident signal at the input of the destination device;

determining the reflected signal at the input of the destination device;

determining a frequency response of the incident signal at the input of the destination device;

determining a frequency response of the reflected signal at the input of the destination device; and determining the reflection coefficient at the input of the destination device by dividing the frequency response of the reflected signal at the input of the destination device by the frequency response of the incident signal at the input of the destination device.

11. The measurement instrument of claim 7, wherein the measurement instrument includes a display configured to display the first probed waveform, the second probed waveform, and the reflection coefficient.

12. The measurement instrument of claim 11, wherein the first probed waveform which is probed at the first location on the signal line and the second probed waveform probed at the second location on the signal line are both provided to a same probe input among the one or more probe inputs via a single probe.

13. A method, comprising:

receiving at a measurement instrument a first probed waveform which is probed at a first location on a signal line between a first device and a second device while an output of the first device sends a first signal to an input of the second device via the signal line and while an output of the second device sends a second signal to an input of the first device via the signal line;

receiving at the measurement instrument a second probed waveform probed at a second location on the signal line while the output of the first device sends the first signal to the input of the second device via the signal line and while the output of the second device sends the second signal to the input of the first device via the signal line, wherein the second location is separated and spaced apart from the first location by a separation distance, and wherein the separation distance produces a time delay for the first signal to propagate from the first location to the second location and for the second signal to propagate from the second location to the first location;

the measurement instrument ascertaining an estimate of the first signal from the first probed waveform and the second probed waveform; and the measurement instrument ascertaining an estimate of the second signal from the first probed waveform and the second probed waveform, wherein ascertaining the estimate of the first signal from the first probed waveform and the second probed waveform comprises:

the measurement instrument delaying the second probed waveform by a processing delay equal to the time delay, to produce a delayed second probed waveform; and the measurement instrument subtracting the delayed second probed waveform from the first probed waveform to produce a difference signal; and the measurement instrument integrating the difference signal to produce the estimate of the first signal.

14. The method of claim 13, wherein the first signal and the second signal are both digital signals.

15. The method of claim 14, wherein the time delay is less than about 1/3 of a rise time of at least one of first signal and the second signal.

16. The method of claim 13, wherein ascertaining the estimate of the second signal from the first probed waveform and the second probed waveform comprises subtracting the estimate of the first signal from the first probed waveform.

17. The method of claim 13, wherein ascertaining the estimate of the second signal from the first probed waveform and the second probed waveform comprises:
   the measurement instrument delaying the first probed waveform by the processing delay equal to the time delay, to produce a delayed first probed waveform;
   the measurement instrument subtracting the delayed first probed waveform from the second probed waveform to produce a second difference signal; and
   the measurement instrument integrating the second difference signal to produce the estimate of the second signal.

18. The method of claim 13, wherein the measurement instrument is an oscilloscope comprising: two probe inputs for receiving the first and second probed waveforms from a first probe and a second probe, respectively.

19. The method of claim 18, further comprising:
   a processor configured to process the first and second probed waveforms; and
   a display configured to display an output signal of the oscilloscope.

20. The method of claim 18, further comprising calibrating a difference between the first probe and the second probe.

* * * * *